US010703490B2

(12) United States Patent
Engelhardt et al.

(10) Patent No.: US 10,703,490 B2
(45) Date of Patent: Jul. 7, 2020

(54) METHOD AND APPARATUS FOR HEAT-DISSIPATION IN ELECTRONICS

(71) Applicant: GE AVIATION SYSTEMS, LLC, Grand Rapids, MI (US)

(72) Inventors: Michel Engelhardt, Woodbury, NY (US); Christopher Mouris Astefanous, Centereach, NY (US)

(73) Assignee: GE Aviation Systems LLC, Grand Rapids, MI (US)

( * ) Notice: Subject to any disclaimer, the term of this patent is extended or adjusted under 35 U.S.C. 154(b) by 462 days.

(21) Appl. No.: 15/335,773

(22) Filed: Oct. 27, 2016

(65) Prior Publication Data

US 2018/0124953 A1 May 3, 2018

(51) Int. Cl.
*B64D 13/08* (2006.01)
*H05K 7/20* (2006.01)

(52) U.S. Cl.
CPC ......... *B64D 13/08* (2013.01); *H05K 7/20409* (2013.01); *H05K 7/20554* (2013.01); *B23P 2700/10* (2013.01)

(58) Field of Classification Search
CPC ............ H05K 7/20409; H05K 7/20554; H01L 23/36; H01L 23/467; B64D 13/08
See application file for complete search history.

(56) References Cited

U.S. PATENT DOCUMENTS

| | | | |
|---|---|---|---|
| 5,016,837 A | 5/1991 | Willis | |
| 6,834,515 B2 | 12/2004 | Sunder et al. | |
| 7,063,131 B2 | 6/2006 | Northrop | |
| 2007/0058336 A1* | 3/2007 | Cheng | G06F 1/20 361/679.46 |
| 2009/0101308 A1 | 4/2009 | Hardesty | |
| 2011/0232885 A1 | 9/2011 | Kaslusky et al. | |

FOREIGN PATENT DOCUMENTS

| | | |
|---|---|---|
| JP | H0613168 U * | 2/1994 |
| JP | 2002299871 A | 10/2002 |

OTHER PUBLICATIONS

JP2002299871 translation.*

* cited by examiner

*Primary Examiner* — Jon T. Schermerphorn, Jr.
(74) *Attorney, Agent, or Firm* — McGarry Bair PC

(57) ABSTRACT

A method and apparatus for heat-dissipation utilizing a fin assembly including one or more fins organized on a wall or base surface. The fins can extend into a flow of fluid passing along the wall or base surface to convectively cool the fins, which can transfer heat from heat-producing components, such as electronics.

16 Claims, 16 Drawing Sheets

METHOD AND APPARATUS FOR HEAT-DISSIPATION IN ELECTRONICS

BACKGROUND OF THE INVENTION

Contemporary aircrafts use avionics in order to control the various equipment and operations for flying the aircraft, among other electrical components. The avionics can include electronic components carried by a circuit board. The electronics, such as avionics or the circuit boards can be stored in an avionics chassis, which performs several beneficial functions, some of which are: electrically shielding the avionics from electromagnetic interference (EMI), protecting the avionics from lightning strikes, environmental exposure, or otherwise. Additional electronic components are often tightly-grouped to save space. Effectively dissipating the heat generated by the avionics or electronic components is important to maintaining the avionics or components within appropriate operational temperatures, particularly within the avionics chassis or other tightly grouped components.

BRIEF DESCRIPTION OF THE INVENTION

In one aspect, the present disclosure relates to a fin assembly exposed to a flow of fluid for thermal cooling including a base surface configured to transfer heat from a heat-producing component. A set of fins extends from the base surface into the flow of fluid with at least one fin of the set of fins including an angled orientation and the at least one fin of the set of fins including a first planar face defining a first side and a second planar face separated from the first planar face by the width of the fin and defining a second side. A set of openings extend between the first planar face and the second planar face. The set of fins is configured to dissipate heat from a heat producing component to fluid adjacent the set of fins.

In another aspect, the present disclosure relates to a finned heat exchanger including a wall configured to transfer heat from a heat-producing component. A set of fins extends from the wall into a flow of fluid with at least one fin of the set of fins including a first planar face and a second planar face separated by a width of the fin and a set of openings extending between the first planar face and the second planar face. The set of fins dissipates heat from the heat-producing component to the flow of fluid.

In yet another aspect, the present disclosure relates to a method of forming a fin heat exchange assembly on a base surface including forming, via additive manufacturing, a set of fins extending from the base surface with at least one of the sets of fins including a first planar face and a second planar face separated by a width of the fin and a set of openings extending between the first planar face and the second planar face.

DETAILED DESCRIPTION OF THE INVENTION

Figure 1:
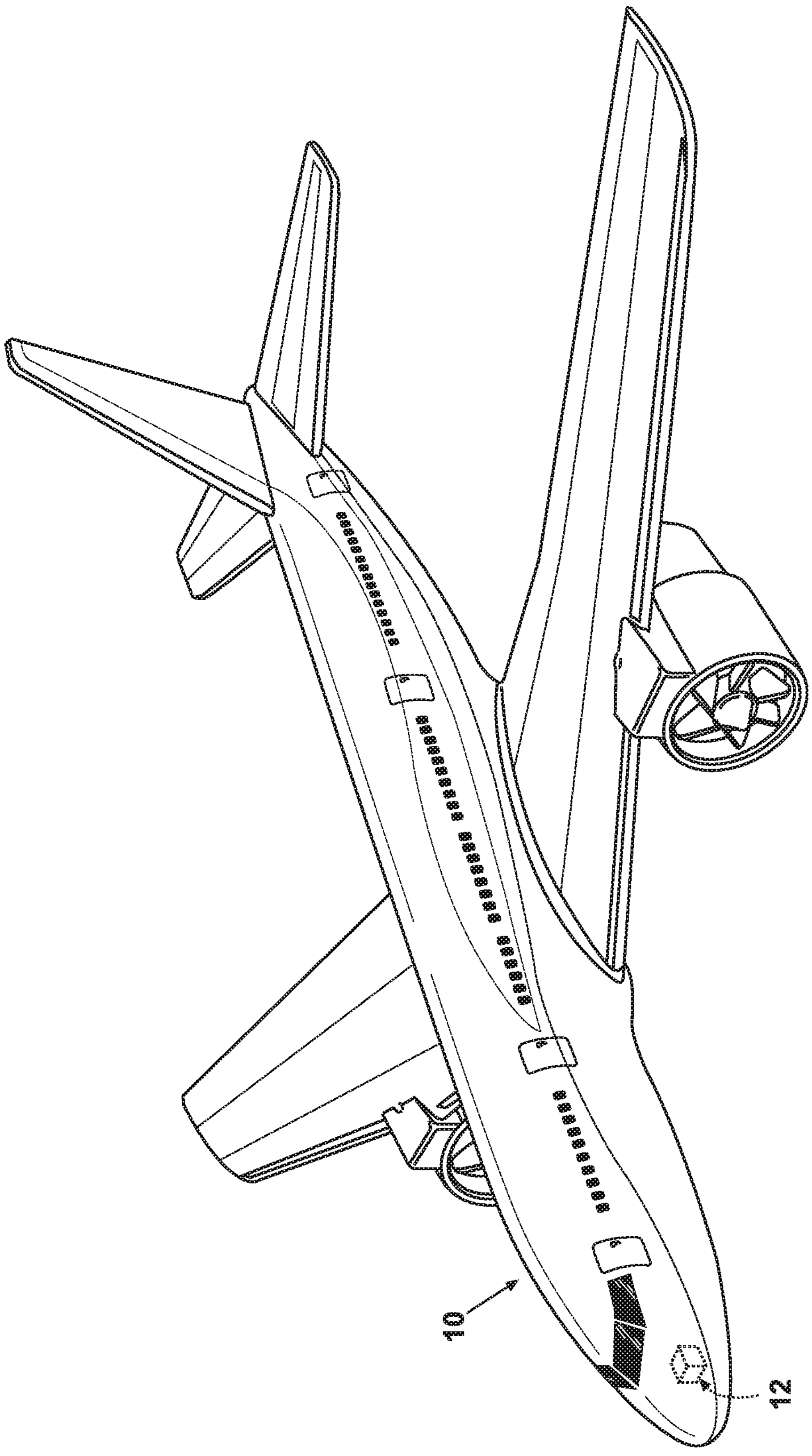
FIG. 1 is a perspective view of an aircraft having an avionics chassis in accordance with various aspects described herein.

Aspects of the disclosure describe an approach to improve function of cooling by improving any combination of fin efficiency, local heat transfer coefficient, and/or specific heat transfer capacity. fins for enhanced thermal dissipation.

Avionics, electronics, or engine components such as those in an aircraft turbine engines, are often convectively cooled by conducting heat to a plurality of fins exposed to a flow of fluid, such as air. In typical conduction-cooled avionics, the heat generated by the electronics is collected by heat spreaders of various designs and materials, and is conducted to the two sides of the circuit card that mate to the chassis by way of wedge locks. Heat conducted to the chassis can be removed by convection through fins disposed on the exterior of the chassis. Avionics including electrical components, and engine components are constantly challenged with dissipating the heat produced within the increasing thermal production within the aircraft environment. The extended range of temperature operation and the ever-increasing power density of state of the art designs results in the thermal design of heat dissipation becoming one of the main limiting factors in the performance of the system or aircraft engine.

While the description of heat dissipating fins will generally pertain to fins disposed on an avionics chassis, it should be appreciated that the fins can be disposed on a plurality of elements, such as any electronics chassis, electronics component level heat sinks such as those relying on conduction, radiation, or natural convection, boiling heat transfer applications in the electric power generation industry (coal, oil, or nuclear industry), or motor heat sinks, such as those in an aircraft engine, for example. Furthermore, the heat dissipating fins as described herein can be useful to any applications utilizing fins for convective cooling. One such example can include fins disposed in a bypass airflow within an aircraft engine for cooling a volume of heat exchanger fluid. Further still, the heat dissipating fins can be useful in environments having high power dissipations with poor cooling environments, such as those often involved with compact avionics and power generation. The fins can be integrated into rectangular, cylindrical, spherical, or non-conforming geometries. This fin assembly is conceived to cool steady state and transient heat loads generated from electronics including SiC as well as any other heat generation such as heat generated from power generation or friction. It has applications in improving fin efficiencies for fins with varying geometries and immersed in different fluid environments, including but not limited to thick fins, long fins, airflow, and liquid environments.

While "a set of" various elements will be described, it will be understood that "a set" can include any number of the respective elements, including only one element. Additionally, all directional references (e.g., radial, axial, upper, lower, upward, downward, left, right, lateral, front, back, top, bottom, above, below, vertical, horizontal, clockwise, counterclockwise) are only used for identification purposes to aid the reader's understanding of the disclosure, and do not create limitations, particularly as to the position, orientation, or use thereof. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other. The exemplary drawings are for purposes of illustration only and the dimensions, positions, order and relative sizes reflected in the drawings attached hereto can vary.

FIG. 1 schematically illustrates an aircraft 10 with an on-board avionics chassis 12 (shown in phantom) for housing avionics, electronics, electrical components, or avionics components for use in the operation of the aircraft 10. The avionics chassis 12 houses a variety of avionics elements and protects them against contaminants, electromagnetic interference (EMI), radio frequency interference (RFI), vibrations, and the like. While illustrated in a commercial airliner, the avionics chassis 12 can be used in any type of aircraft, for example, without limitation, fixed-wing, rotating-wing, rocket, commercial aircraft, personal aircraft, and military aircraft, as well as any vehicle requiring similar protection. The avionics chassis 12 can be located anywhere within the aircraft, not just the nose as illustrated. Furthermore, aspects of the disclosure are not limited only to aircraft aspects, and can be included in other mobile and stationary configurations. Non-limiting example mobile configurations can include ground-based, water-based, or additional air-based vehicles.

Figure 2:
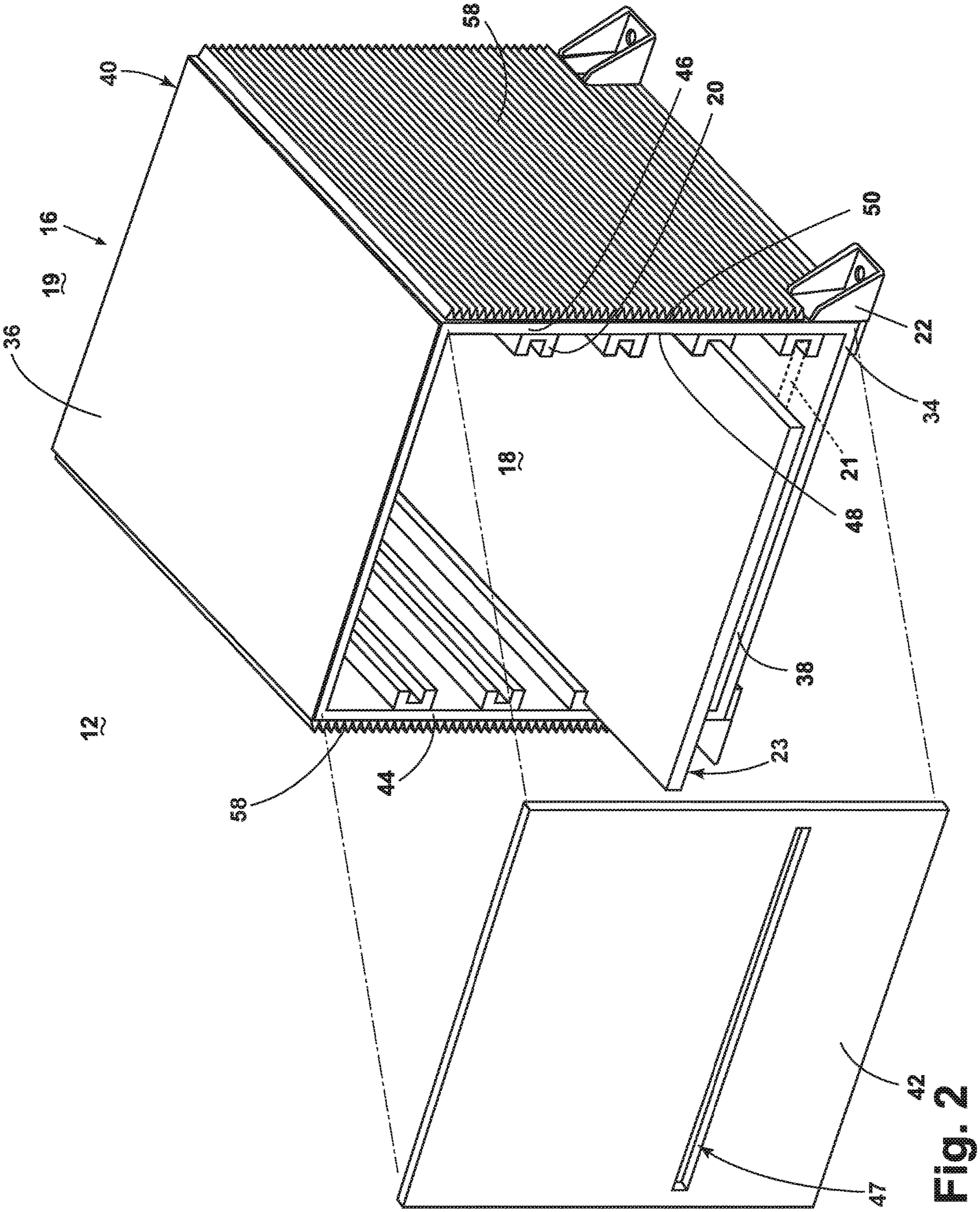
FIG. 2 is a partially exploded perspective view of the avionics chassis having a plurality of fins in accordance with various aspects described herein, with a cover removed for clarity.

FIG. 2 illustrates the avionics chassis 12 according to an aspect of the present disclosure, with a front cover 42 removed. The avionics chassis 12 includes a chassis housing 16 defining an interior 18 and exterior 19 of the avionics chassis 12. The avionics chassis 12 can include a chassis frame 34 having a top cover 36, a bottom wall 38, a back wall 40, and opposing sidewalls 44, 46, collectively referred to as the walls. The frame 34 can further include the aforementioned selectively removable front cover 42, providing access to the interior 18 of the avionics chassis 12 when removed, and at least partially restricting access to the interior 18 when coupled or mounted to the frame 34. The sidewalls 44, 46 can include an interior surface 48 and an exterior surface 50.

As shown, a set of heat-dissipating elements, shown as fins 58, can project from the exterior surface 50 of the sidewalls 44, 46. While heat-dissipating fins 58 are shown on the sidewalls 44, 46, the fins 58 can be disposed on any exterior portion of the chassis 12, such as the top cover 36 or the bottom wall 38 in non-limiting examples. While the fins 58 are shown extending fully along the sidewalls 44, 46, it should be appreciated that the fins 58 need not extend the full length of the sidewalls 44, 46, and can be organized in sets of rows or columns along the walls, in non-limiting examples. Additionally, fins 58, rows, or columns can be aligned, unaligned, offset, patterned, or otherwise organized to improve heat transfer and dissipation. In order to provide heat dissipation at the fins 58, an airflow can be provided along the fins 58 to remove heat through convection. The fins 58 can be made of aluminum, copper, graphene, or other metallic composites in non-limiting examples. Manufacture of the fins can be accomplished, for example, by additive manufacturing such as 3D printing including direct metal laser melting (DMLM).

The avionics chassis 12 can further include a set of thermally conductive card rails 20 within the interior 18 and supported by the interior surface 48 of the sidewalls 44, 46. The set of card rails 20 can be horizontally aligned on the interior surfaces 48 of the spaced on opposing sidewalls 44, 46 to define effective card slots 21 (illustrated by the dashed lines) therebetween for receiving at least a portion of an operable avionics system card 23. While only a single avionics system card 23 is shown, the avionics chassis 12 can be configured to house, support, or include a set of avionics system cards 23.

The removable front cover 42 can be selected or configured to include a set of cover openings 47 that can be aligned with a corresponding set of avionics system cards 23 such that when the front cover 42 is coupled or mounted with the frame 32, at least a portion of the avionics system card 23 can extend from the interior 18 to the exterior 19 of the avionics chassis 12. Stated another way, the avionics chassis 12 or the avionics system card 23 can be selected or configured such that at least a portion of an avionics system card 23 can extend through a corresponding opening 47 or aperture in the chassis 12 or front cover 42. In this sense, the opening 47 can be sized, shaped, profiled, or contoured to align or correspond with at least a portion of the avionics system card 23. While the avionics system card 23 is illustrated extending through an opening 47 in the front cover 42, aspects of the disclosure can be included wherein the avionics system card 23 is selected, designed, or configured such that at least a portion of the card 23 extends beyond or past a physical or referential plane defined by the avionics chassis 12, front cover 42, side walls 44, 46, frame 34, or combination of boundaries thereof.

The avionics chassis 12 is illustrated including a set of mounting feet 22 extending from the chassis housing 16 to facilitate mounting the avionics chassis 12 to the aircraft 10 by means of bolts or other conventional fasteners. Further, the mounting feet 22, can function as an electrical ground to ground the avionics chassis to the frame of the aircraft 10. While mounting feet 22 are shown in this example, the avionics chassis 12 can be used with many types of attachment mechanism.

Figure 3:
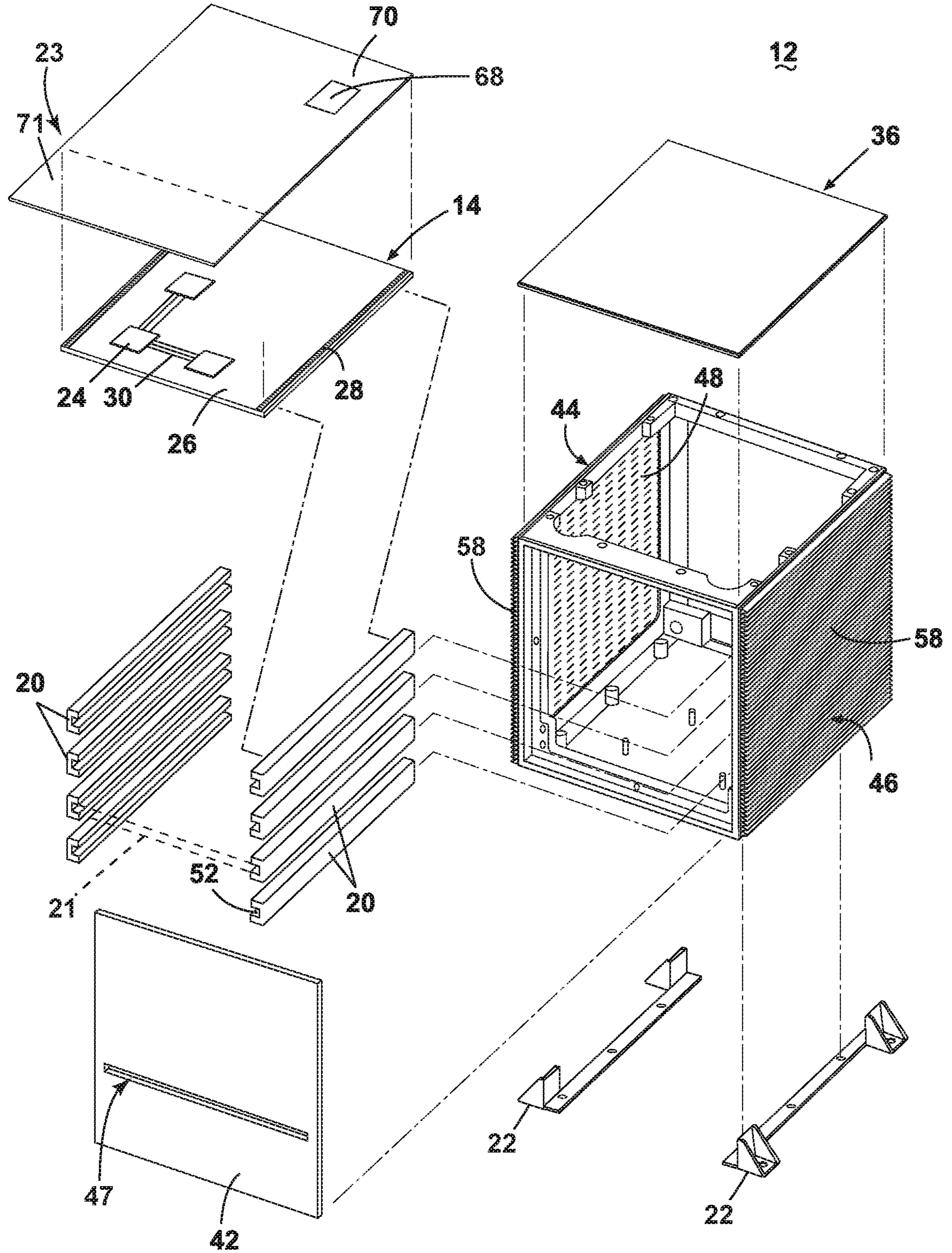
FIG. 3 is an exploded view of the avionics chassis with fins shown in FIG. 2, in accordance with various aspects described herein.

FIG. 3 illustrates an exploded view illustrating the avionics chassis 12 and avionics system card 23 in further detail. As shown, the avionics system card 23 can include a heat spreader or thermal plane 70 and circuit card assembly, shown as a printed circuit board (PCB) 14 or electronic circuit board. The PCB 14 can further include a substrate 26 supporting or carrying a set of electronics or heat producing components 24. The PCB 14 or the substrate 26 can further include a set of electrical or thermal conductors 30 interconnecting the set of heat producing components 24. A non-limiting list of heat producing components 24 can include electrical circuity, power electronics such as capacitors, transformers, or the like, a semiconductor chip, a processor, memory chips, or the like.

The substrate 26 can include a thermally conductive or non-conductive material. The PCB 14 or substrate 26 can be provided with thermally conductive side strips 28 located along the exterior edges of the PCB 14. The conductors 30 can be configured to operate or create at least a portion of a thermally conductive path from the heat-producing component 24 to an edge of the substrate 26 or PCB 14, such as to the thermally conductive side strips 28. In this sense, the conductors 30 can provide a direct thermal pathway from the interior to the periphery of the substrate 26. The side strips 28 can further provide a thermally conductive interface or pathway to the card rails 20. The conductors 30 can be one or more metal strips, including, but not limited to, copper or another electrically or thermally conductive material formed in or provided on the substrate 26.

The thermal plane 70 can be configured in an overlying relationship with the PCB 14, and can further include an extending thermal plane portion 71 of the thermal plane 70. The extending thermal plane portion 71 is shown to extend parallel to the longitudinal direction of the side strips 28, that is, extending in the direction of a front of the PCB 14 or avionics system card 23, wherein the extending thermal plane portion 71 can be at least partially received by, or extend through the cover opening 47 of the front cover 42 in an assembled avionics chassis 12. The thermal plane 70 and the extending thermal plane portion 71 can include a thermally conductive material, including but not limited to copper. When the thermal plane 70 and the extending thermal plane portion 71 are assembled with the PCB 14 to form the avionics system card 23, the planes 70, 71 are configured to be arranged in a thermally conductive relationship with at least a subset of the heat producing components 24, the conductors 30, or the side strips 28. In this sense, heat generated or produced by at least a subset of operable heat producing components 24 can be thermally conducted to the overlying thermal plane 70, which the heat can be further thermally conducted to the side strips 28, to the extending thermal plane portion 71, or a combination thereof.

The illustration of the thermal plane 70 and the extending thermal plane portion 71 indicates the plane 70 and plane portion 71 are separated by a dashed line for understanding. Aspects of the disclosure can be included wherein the thermal plane 70 and extending thermal plane portion 71 are a single integral plane, or are separate planes thermally coupled to one another. In one non-limiting example configuration, the cover opening 47 can be configured to receive only the thermal plane 70 or the extending thermal plane portion 71. In another non-limiting example configuration, the front cover 42 can include a set of cover openings 47 configured or selected to receive a corresponding set of thermal planes 70 or extending thermal plane portions 71.

Aspects of the disclosure can be included wherein the extending thermal plane portion 71 can be configured in an overlying relationship with the PCB 14, such as a PCB 14 also having an extending portion, or the extending thermal plane portion 71 can be configured to extend beyond the relationship with the PCB 14. Aspects of the disclosure can also be included wherein the thermal plane 70 or the extending thermal plane portion 71 can include discontinuities, such as gaps, holes, or cutouts 66. For example, a cutout 66 can be included to reduce materials, so long as the cutout 66 does not inhibit the thermally conductive relationship of the respective plane 70, 71 with the heat producing component 24 or conductor 30.

The set of card rails 20 for the avionics chassis 12 can be configured to abut the interior surface 48 and can be fixedly mounted thereto. The set of card rails 20 can be attached to the interior surface 48 using any convenient method such as mechanical fasteners, solders, brazes, welds, adhesives, and the like. Aspects of the card rail 20 can be configured to include two legs that define a groove or channel 52, extending along the length of the sidewalls 44, 46 (e.g. from front to back, or between the front cover 42 and the back wall) which partially defines the slot 21 for receiving the avionics system card 23. The set of card rails 20 can be arranged in pairs, with one card rail 20 residing on the sidewall 44 and a corresponding card rail 20 residing on the opposing sidewall 46. Parallelism between the pair of card rails 20 can be utilized to ensure that the PCB 14 or the avionics system card 23 will slide into the slot 21 or channel 52 properly. The interaction of the pair of card rails 20 and the PCB 14 or the avionics system card 23 can be referred to as "wedge locks." The card rails 20 can be made of any suitable thermally conductive material including either machined or extruded aluminum, copper, aluminum/beryllium alloy, machined silicon carbide or a metal matrix composite. As such, the card rails 20 can conduct heat from the PCB 14, and any electronics thereon, to the side rails 20. Aspects of the disclosure can further be included wherein the attachment of the set of card rails 20 to the side walls 44, 46 include a thermally conductive relationship, such that the set of card rails 20 are thermally coupled with at least one of the side walls 44, 46, the avionics chassis 12, or the heat-dissipating fins 58. In the configuration, the fins 58 can be used to dissipate heat conducted from the PCB 14 or any electronics thereon. Convection, which can be generated by passing an airflow over the fins 58, can be used to dissipate the heat form the avionics chassis 12.

While the fins 58 have been described in relation to the avionics chassis 12, it should be understood that heat-dissipating fins can be utilized in a number of applications for removal of heat. Such non-limiting examples can include electronics-component level heat sinks, boiling heat transfer applications, such as that of the nuclear industry, or motor heat sinks, such as that of an aircraft turbine engine convectively cooled with a bypass airflow.

Figure 4:
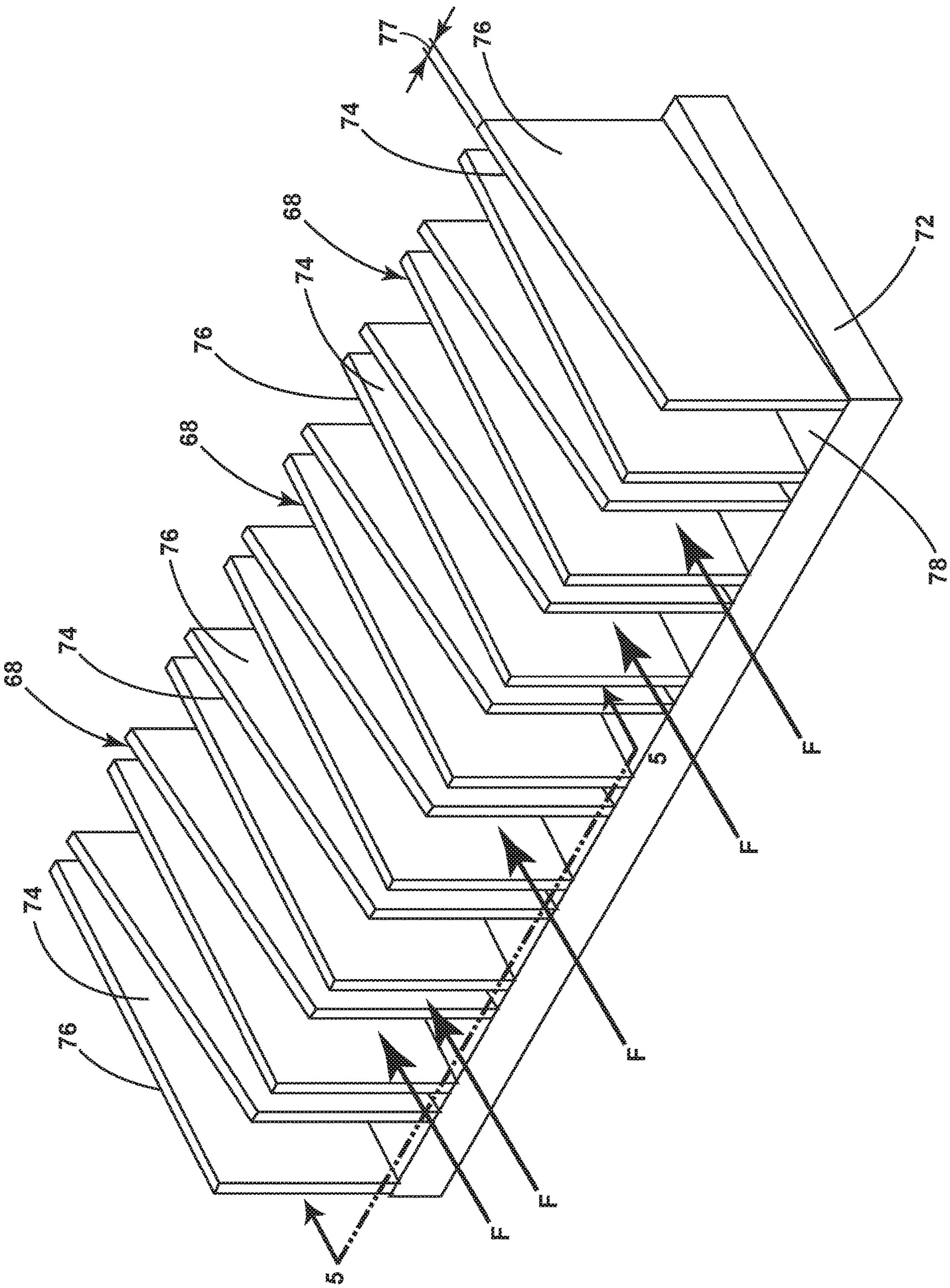
FIG. 4 is a perspective view of the fins of FIGS. 2 and 3 in a first angled orientation, in accordance with various aspects described herein.

FIG. 4 illustrates a heat exchanger including a set of fins 68, which can be the fins 58 as previously described, disposed on a wall 72 including a base surface 78, which can include the walls 38, 40, 44, 46 or covers 36, 42 described herein (see FIG. 2), for example. The wall can include a rectangular profile, as well as a cylindrical or spherical profile, contour or shape in additional non-limiting examples. The fins 68 are arranged in a patterned, angled orientation. While all fins 68 are disposed in the angled orientation, it should be understood that one, all, or a discrete set, pattern or organization of fins 68 can be disposed at the angled orientation.

Each fin 68 includes a first planar face defining a first side 74 and a second planar face defining a second side 76, separated from the first side 74 by a width 77 of the fin 68. The fins 68 extend from a base surface 78 the wall 72. While the pairs or sets of fins 68 are illustrated as spaced in a patterned manner, it should be appreciated that the spacing can be unequal, variable, or unique based upon the particular needs of the object or component coupled to the fins 68. For example, the fins can be arranged based upon particular local cooling needs, having a greater or lesser concentration of fins 68 in order to increase or decrease convective cooling locally. The fins 68 can be made from aluminum, copper, graphene, or other similar metallic in non-limiting examples.

A flow of fluid F, such as air in one non-limiting example, can be provided to pass through the fins 68. The first side 74 and second side 76 can be defined by the flow of fluid F. The angled orientation of the fins 68 arranges the first side 74 to confront the flow of fluid F, while the second side 76 is angled away from the flow of fluid F. However, it should be understood that the arrangement first side 74 and the second side 76 are arbitrary, such that at least one side of the fin 68 at least partially confronts the flow of fluid F. The angled orientation can be defined relative to a streamline of the local flow of fluid F, which preferably is generally linear and parallel to the base surface 78. As such, one of the first or second sides 74, 76 is offset from streamline of the flow of fluid F, defining the angled orientation of the fins 68.

The angled orientation increases the surface area of the fins 68 confronting the flow of fluid F. The increased surface area confronting the flow of fluid F increases the heat transfer coefficient along the surface of the fin 68. This increases the heat transfer coefficient and improves the efficiency of the fins 68, improving convective cooling. Improved cooling of the fins 68 can reduce the required number of fins 68, reducing overall weight, which can be critical in aircraft implementations.

Figure 5:
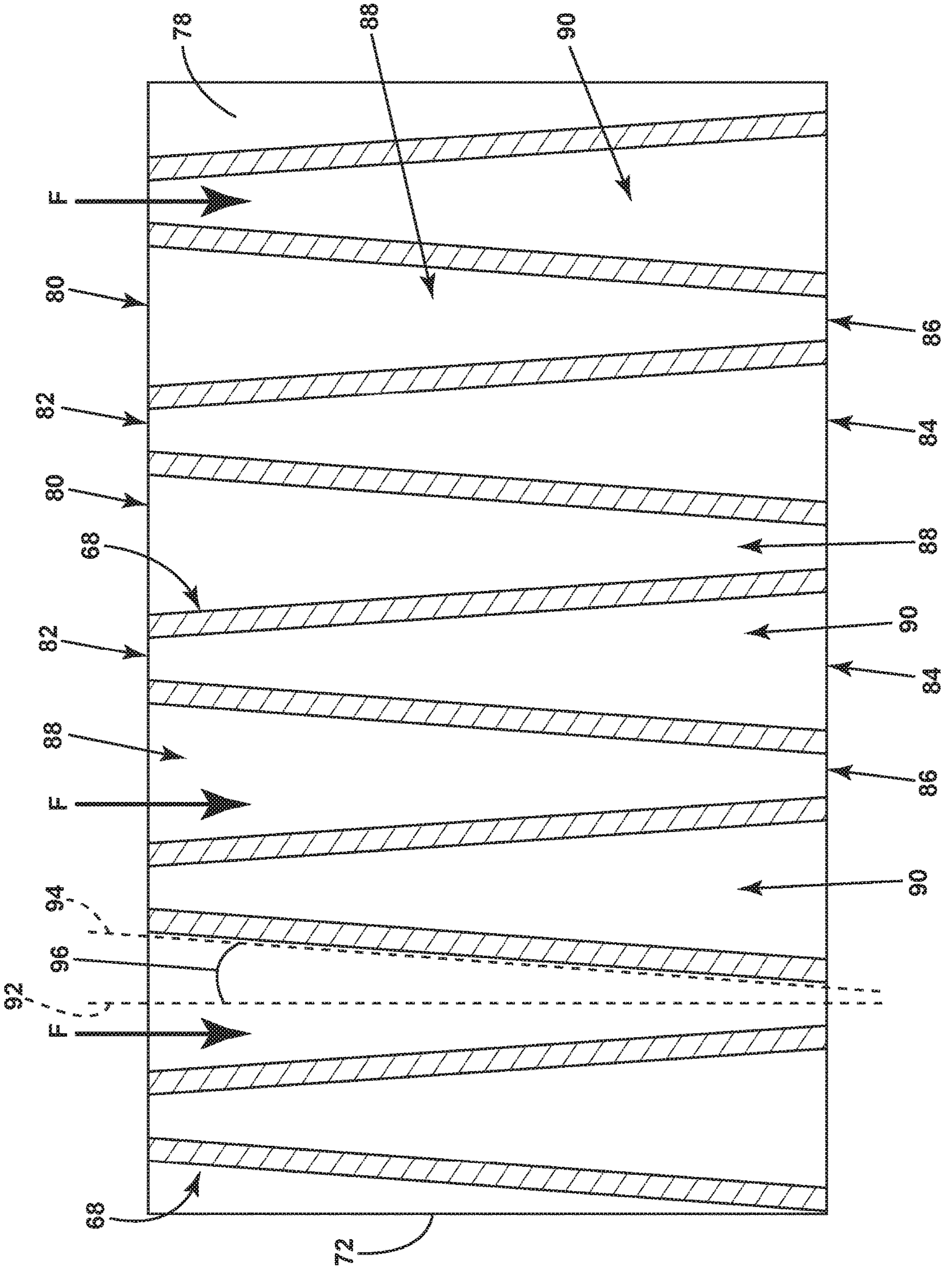
FIG. 5 is a top view of the fins of FIG. 4 illustrating the angled orientation of the fins, in accordance with various aspects described herein.

FIG. 5 is a top view of the fins 68 shown in FIG. 4 better illustrating the angled orientation relative to the flow of fluid F. The angled orientation among adjacent fins 68 is opposite to define a pattern of wide inlets 80, narrow inlets 82, wide outlets 84 and narrow outlets 86 between the fins 68. A greater portion of the flow of fluid F can enter the fins 68 at the wide inlets 80 and a lesser portion of the flow of fluid F enters into the narrow inlets 82. In the illustrated example, each wide inlet 80 fluidly couples with a narrow outlet 86 to form a converging flow path 88, and each narrow inlet 82 fluidly couples with a wide outlet 84 to form a diverging flow path 90. In the converging flow path 88, the flow of fluid F is accelerated. It will be understood that the fins 68 can be oriented in any manner and this need not be the case. In the diverging flow path 90, the flow of fluid F decelerates. As such, a pressure differential forms on opposing sides of each fin 68.

The pressure differentials and accelerated or decelerated flows can be adapted to enhance cooling for the particular fins 68 or the overall system. The pressure differentials can cause flow separation along the fins 68. For example, the Reynolds number for detachment of the flow along the surface of the fin 68, or conversion of the flow from laminar to turbulent can be decreased. With a lowered Reynolds number, entrainment and turbulent flow occurs more readily and enhances heat transfer as opposed to the laminar flow. Thus, heat transfer is further improved with turbulent flows along the fin 68. Additionally, the pressure differentials or the accelerated velocity of the airflow can be utilized to draw a portion of the flow of fluid F along a portion of the fin 68, which might otherwise experience a lower rate of contact with the flow of fluid F.

A flow axis 92 can be defined parallel to the flow of fluid F. The fins 68 can define a fin axis 94 extending in the longitudinal direction of the fin 68 parallel to the base surface 78. A first fin angle 96 can be defined as the angle between the flow axis 92 and the fin axis 94. The first fin angle 96 positions the fins 68 in the angled orientation. The first fin angle 96 can be adapted confront a greater or lesser portion of the flow of fluid F passing along the fins 68. In one example, the first fin angle 96 can be about 4-degrees. It should be understood that a wide variety of angles from 1-degree to 89-degrees for the first fin angle 96 are contemplated, which can be determined, in non-limiting examples, by the velocity of the flow of fluid F, heat dissipation needs, or system weight requirements. It should be appreciated that in the angled orientation based upon the first fin angle 96 can be used to improve the heat dissipation by fins 68 by increasing surface area confronting the flow of fluid F, as opposed to typical fins aligned with the flow of fluid F where the flow of fluid F passes between adjacent fins. The angled orientation of the fins 68 increases the heat transfer coefficient to improve convective cooling and the efficiency of the fins 68.

Figure 6:
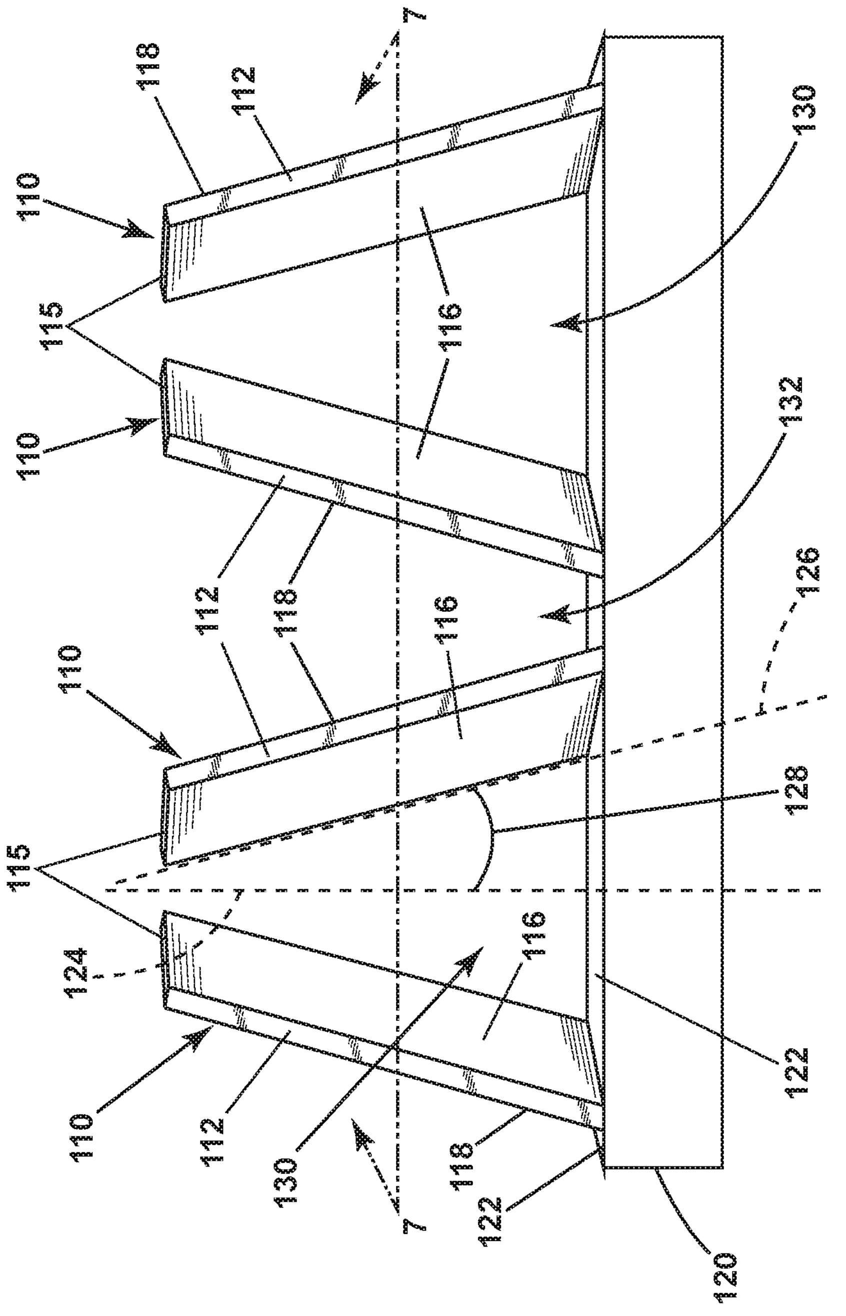
FIG. 6 is a front, perspective view of two sets of fins of FIGS. 2 and 3 in both a first and second angled orientation, in accordance with various aspects described herein.
Figure 7:
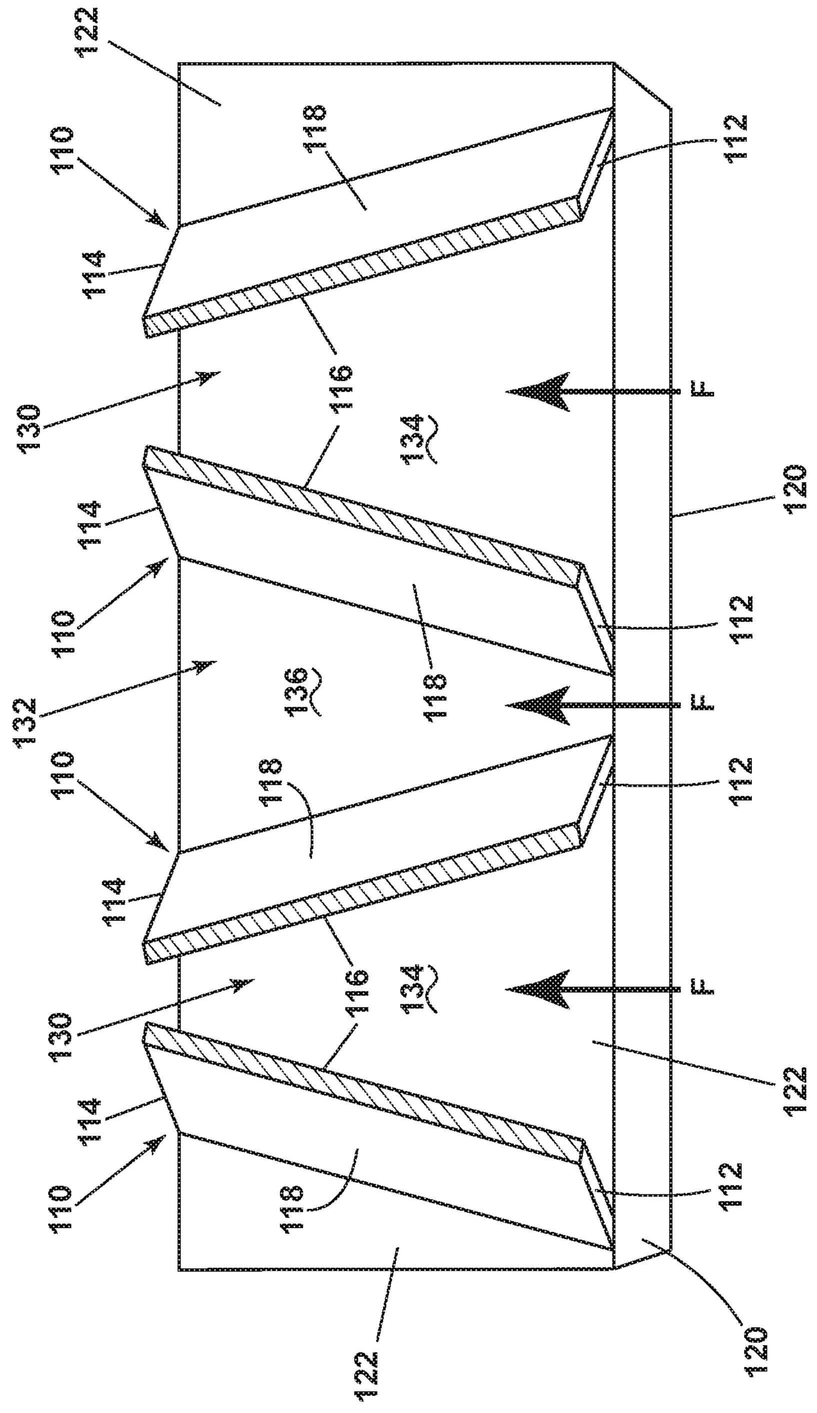
FIG. 7 is a top, perspective view of two sets of fins of FIG. 6, in accordance with various aspects described herein.

Referring to FIG. 6, illustrating a front view of a set of fins 110 provided on a base surface 122 of a wall 120, including the angled orientation defined by the first fin angle 96 of FIGS. 4 and 5. Each fin includes a front surface 112 with an opposing rear surface 114 (FIG. 7). Each fin includes a top surface 115, extending from the front surface 112 to the rear surface 114. The fins 110 also include a first planar face defining a first side 116 and a second planar face defining a second side 118. In the orientation of the fins 110 as shown, the first side 116 is angled toward the viewer, while the second side 118 is hidden from view.

A perpendicular axis 124 can be defined perpendicular to and extending through the wall 120, perpendicular to the base surface 122. A second fin axis 126 can be defined along the fin 110 extending from the base surface 122. A second fin angle 128 can be defined between the second fin axis 126 and the perpendicular axis 124 to further define the angled orientation for the fin 110. The second fin angle 128 can be less than 90-degrees, for example. The angled orientation of the fins 110 defined by the second fin angle 128 further defines a covered portion 130 and an open portion 132. The covered portion is defined between adjacent first sides 116 of the fins 110 and is converging in a direction away from the wall 120. The covered portion 130 should be understood as at least partially positioned over the base surface 122, and does not necessarily encase or wholly cover the base surface 122 within the covered portion 130. The open portion 132 is defined between adjacent second sides 118 of the fins 110, and is diverging in a direction away from the wall 120.

In the angled orientation as defined by the second fin angle 128, the fins 110 are organized to drive the flow of fluid F toward the base surface 122 within the covered portion 130. In FIG. 6, the flow of fluid F can be provided into the page toward the fins 110. Under this provision of the flow of fluid F, the flow of fluid F is directed downward within the covered portion 130, toward the wall 120. As such, the convective cooling toward the bottom of the fins 110 is improved. A problem with typical fin-convection cooling is that the airflow stays near the tops of the fins away from the wall to which the fins mount, and convection near the point of attachment of the fins is minimal. Utilizing the fins 110 oriented at the second fin angle 128, the flow of fluid F can be driven toward the wall 120 to improve cooling at the base of the fins 110. As such, the heat transfer coefficient of the fin 110 is improved. In addition, some of the flow of fluid F can pass along the base surface 122, convectively cooling the wall 120 in addition to the fins 110.

Referring now to FIG. 7, taken across section 7-7 of FIG. 6, the flow paths pass through the fins 110 at the front faces 112 toward the rear faces 114. The angled orientation of the second fin angle 128 of FIG. 6, shows the second sides 118, while the first sides 116 are hidden from view. The angled orientation of the fins 110 about the first fin angle 96, as described in relation to FIGS. 4 and 5, defines converging flow paths 134 and diverging flow paths 136. The converging flow paths 136 in combination with the covered portion 130 can drive the flow of fluid F toward the base surface 122 and the portions of the fins 110 adjacent to the wall 120.

Furthermore, the fins 68 arranged in the angled orientation relative to the first fin angle 96 as described in FIGS. 4-5 provided in combination with the angled orientation defined by the second fin angle 128 can further accelerate the flow of fluid F within the converging flow path 88 (FIG. 5) and the covered portion 130. Such increased acceleration can further improve the heat transfer at the fins 68, 110. Thus, even less number of fins 68, 110 may be required to effectively cool the system, further minimizing system weight.

Figure 8:
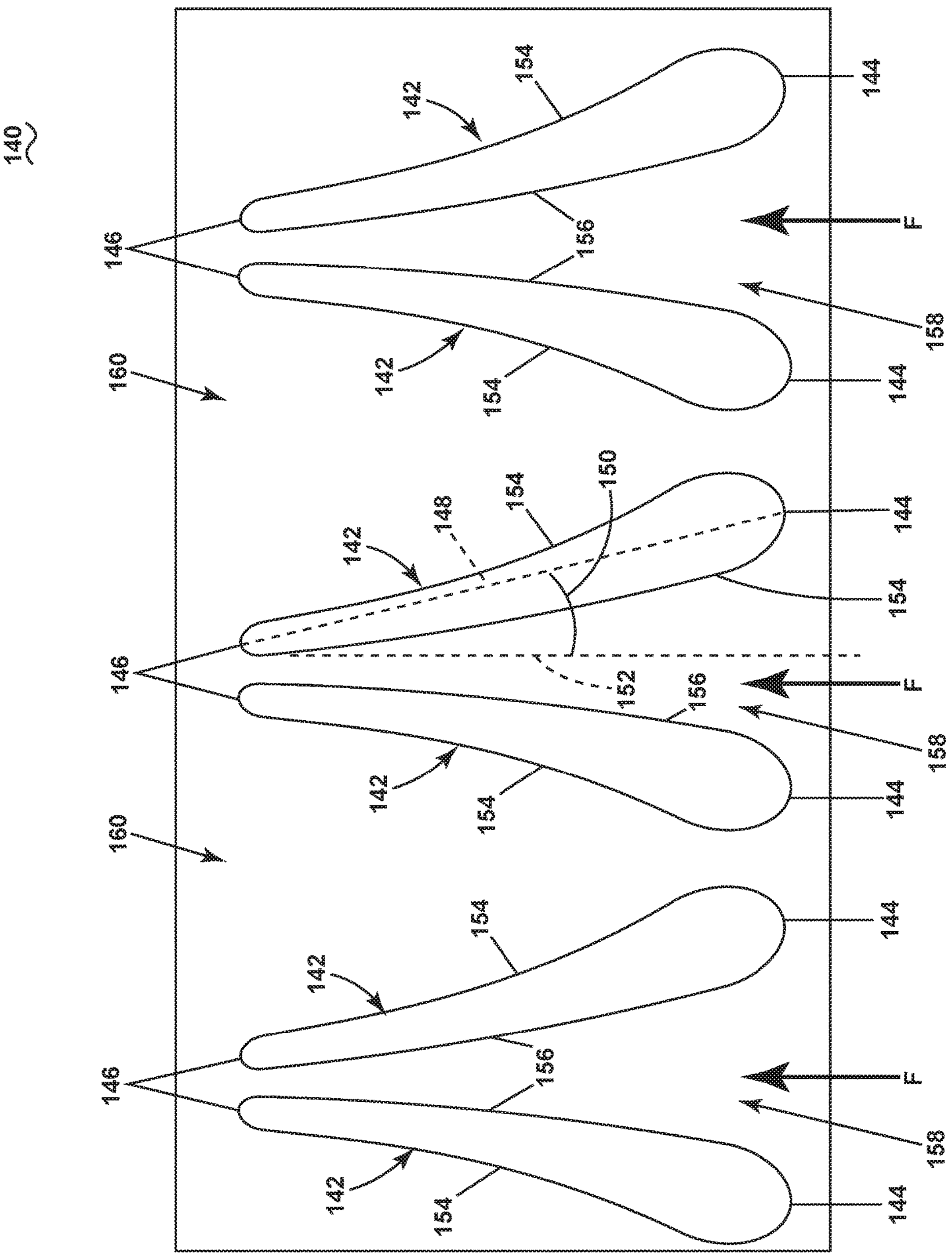
FIG. 8 is a top view of a plurality of fins having an airfoil shape and positioned in an angled, arcuate orientation, in accordance with various aspects described herein.

Referring now to FIG. 8, a set of fins 140 is illustrated with each fin 142 having an airfoil shape. Each airfoil-shaped fin 142 includes a leading edge 144 first confronting the flow of fluid F and a trailing edge 146 opposite the leading edge 144. The leading edge 144, alternatively, can be the point on the forward side of the airfoil with a minimum radius and the trailing edge can be the point on the rear side of the airfoil with a minimum radius. A chord 148 can be defined as a line extending from the leading edge 144 and the trailing edge 146. The chord 148 can be disposed at an angle 150 relative to a flow axis 152 along the local flow path of the flow of fluid F, which can be equivalent to the flow axis 92 of FIG. 5. As such, the fins 142, while shaped as airfoils, can still be oriented at an angled disposition according to the angle 150, similar to the first fin angle 96 of FIGS. 4 and 5. The angle 150 can be about 4-degrees, for example. Additionally, while not shown in FIG. 8, it is contemplated the airfoil-shaped fins 140 can be angled relative to the second fin angle 128 of FIG. 7.

The airfoil shape of the fin 142 defines a first side as a pressure side 154 and a second side as a suction side 156. The angled disposition of the fins 142 can further define a converging flow path 158 and a diverging flow path 160 on opposing sides 154, 156 of the airfoil fin 142. The converging and diverging flow paths 158, 160, in combination with the airfoil shaped fins 142, can create pressure differentials between the opposing sides 154, 156 of the fins 142, accelerating or decelerating the flow of fluid F passing through the fins 142. The orientation of the pressure and suction sides 154, 156, such as the suction sides 156 being adjacent the converging flow path 158, can be used to optimize the pressure differentials between the fins 142. Such optimization can be used to improve the convective heat transfer along the fins 142, as well to lower the Reynolds number along the fin 142 to increase the turbulence generated by the fin 142 to further improving heat transfer.

Additionally, it should be understood that the fin geometry as illustrated in the drawings is by way of example only and is not limiting. For example, a particular fin can have a plurality of faces, beyond just the first and second surfaces, or the pressure and suction sides of the airfoil shaped-fin. For example, the fin can be T-shaped, or have a t-shaped cross-section, having six surfaces. Additionally, the openings as described herein can be applied to the multiple surfaces to improve convection or heat transfer among multiple faces or fin geometries.

Figure 9:
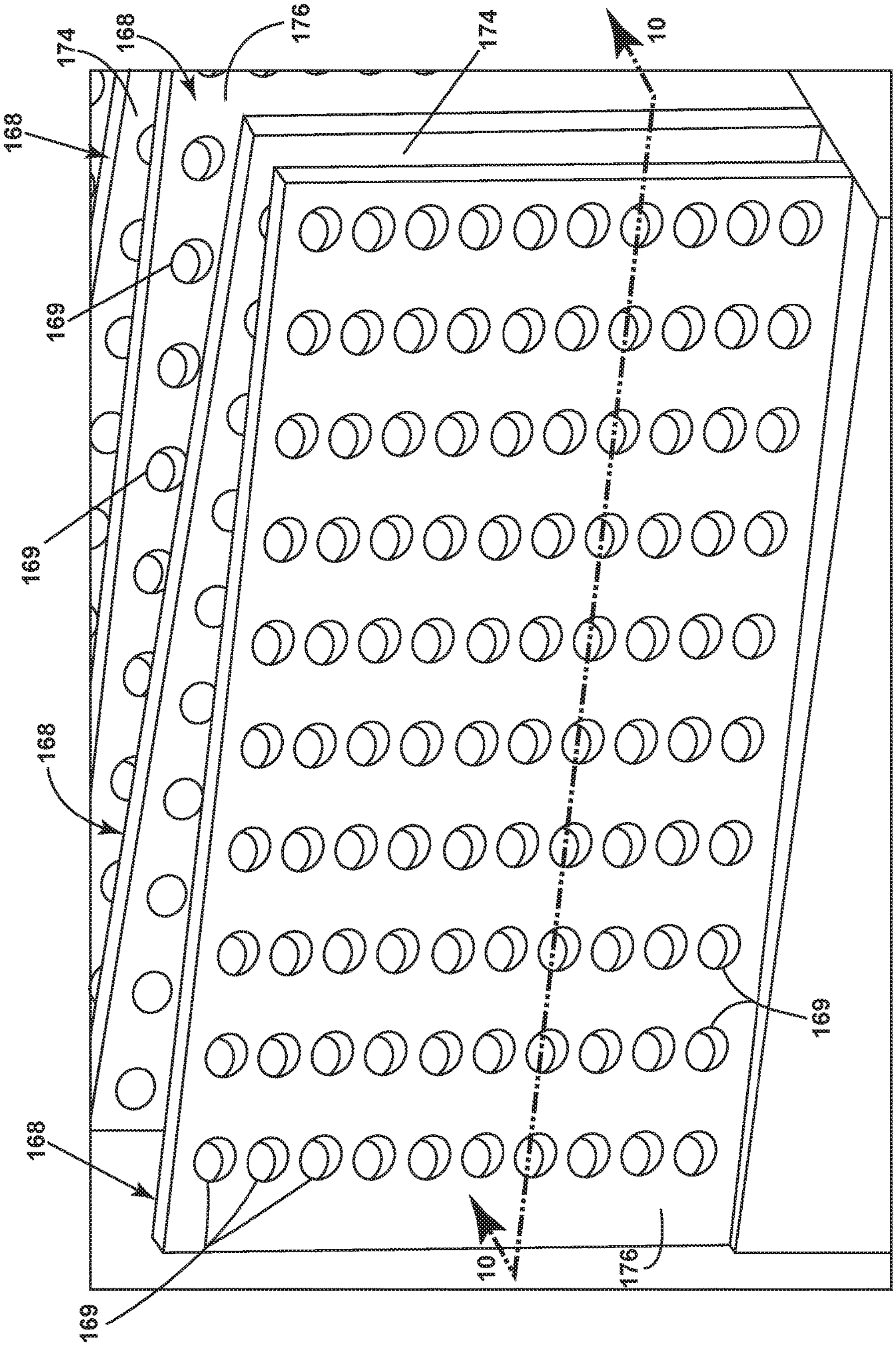
FIG. 9 is an enlarged perspective view of a plurality fins disposed in the first angled orientation, including a plurality of openings, in accordance with various aspects described herein.

Referring now to FIG. 9, another heat exchanger including a portion of a set of fins 168 is shown organized similar to the fins of FIGS. 4 and 5, and including a plurality of cooling holes as openings 169 disposed in the fins 168. The fins 168 can be substantially similar to the fins of FIGS. 4 and 5, As such, similar numerals will be used to described similar elements, increased by a value of one hundred. The fins 168 can include a first side 174 and a second side 176, with the openings 169 passing from the first 174 to the second side 176. The openings 169 can be a cylindrical-shaped hole provided in the fins 168, in one non-limiting example, while openings of any shape are contemplated. The openings 169 may not be uniform in geometry and can be circular, conical, and elliptical or can be a mixture of varying geometry. Each opening or pattern of openings can include linear and non-linear paths. For example, the airflow defined through the openings 174 produces a linear path through the fins 168. As the air flows over the openings 169, the air is entrained by the linear airflow at 174 and creates a non-linear flow path by entraining air through the openings 169. Thus, it should be appreciated that the openings connecting any two faces need not be linear, and that such non-linear geometries can generate complex airflows such as polynomial curves with variables cross-sections; all of which can improve local convection and overall heat transfer. The openings 169 can be arranged in the fin 168 in a patterned manner, such as rows or columns, aligned or patterned, or otherwise organized. Alternatively, it is contemplated that the openings 169 be organized based upon a temperature gradient. For example, the fins 168 typically have greater temperatures nearer to the base of the fins 168. As such, an increased amount of openings 169 can be placed near the base to improve heat transfer near the base. It should be appreciated that the opening organizations as described are by way of example only, and that any organization of openings 169 is contemplated. Additionally, the openings 169 can be of any size, being large or small. The greater number of openings 169 or the greater the size of the openings 169 effectively decreases weight of the fins 168, and can increase overall efficiency, such as in aviation applications. However, a balance between the number of openings 169 and the surface area of the fins 168 needs to be achieved. As such, the surface area of the fins 168 can determined as a function of the openings 169, including such determinative variables such as opening 169 size and count. As the number or size of openings 169 increases, the surface area of the fins 168 decreases, minimizing the potential for heat transfer. As such, overall efficiency can be balance with cooling efficiency of the fins 168 with the amount of openings 169 utilized. In one non-limiting example, a ratio of 3:1 surface area to openings 169 can be utilized. However, it should be understood that while a greater number of openings 169 can decrease surface area, effectively decreasing heat transfer, placement of such openings can improve heat transfer, or optimize a temperature gradient, while decreasing surface area. Thus the function balancing openings 169 with surface area can be subject to additional factors, such as opening placement, heat gradient, fin orientation, fin count, fin thickness, fin length, airflow pressure, fluid flow rate, fluid temperature, or fin material in non-limiting examples. Additionally, the number of openings 169 can further decrease overall weight of the system, providing further benefit in such weight-sensitive environments, such as aviation implementations.

Figure 10:
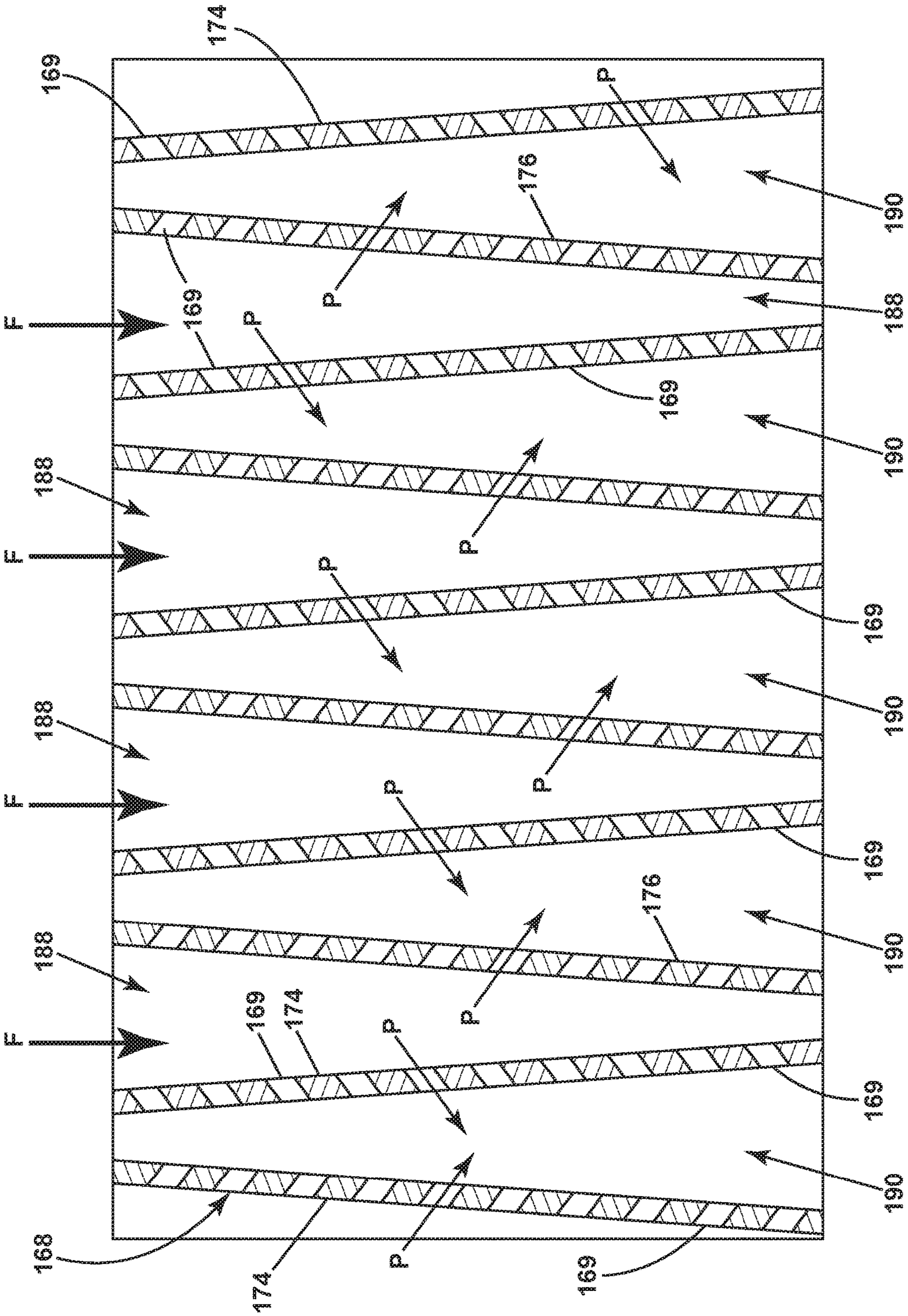
FIG. 10 is a top view of the fins of FIG. 9, in accordance with various aspects described herein.

Referring now to FIG. 10, illustrating a cross-sectional view of the fins 168 of FIG. 9 taken across section 9-9 of FIG. 9, the openings 169 can be angled in the direction of the flow of fluid F, for example, to provide a portion of the flow of fluid P through the fins 168 forming a converging flow path 188 to a diverging flow path 190 on the opposite side of the fins 168. In this way, the increased pressure of the converging flow path 188 can be provided to the diverging flow path 190 through the openings 169, while maintaining the advantages of accelerating the fluid through the converging flow path 188 as well as increasing the contact surface area of the fins 168 by angling them into the flow path of the flow of fluid F. Additionally, passing the flow of fluid F to the diverging flow path 190 can improve heat transfer on the opposite sides of the fins 168, where stagnation or low velocity airflows may exist.

Referring now to FIGS. 11A-14B, the openings 169 of FIGS. 9 and 10 can be particularly shaped to affect the partial flow of fluid P passing through the openings 169. The shapes shown in FIGS. 11A-14B are exemplary of some of the openings 169 passing from the first side 174 to the second side 176 that can be utilized in providing a flow of fluid F through the fins 168, and should not limit the openings 169 to the examples as shown.

Figure 11A:
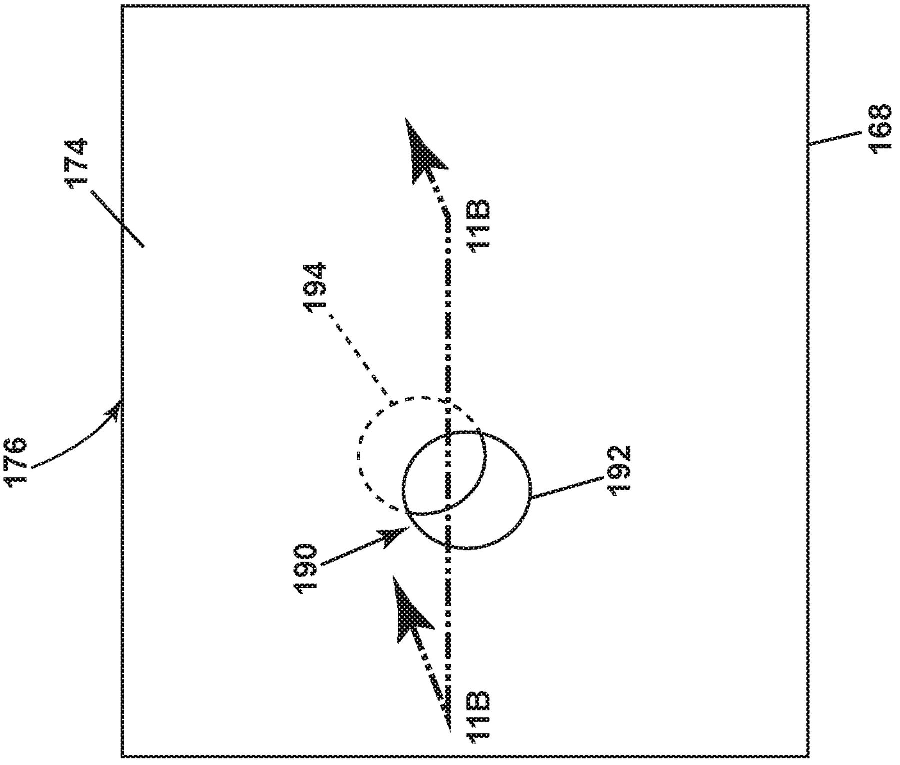
FIG. 11A is a front view of the openings of FIG. 9 having an angled disposition, in accordance with various aspects described herein.
Figure 11B:
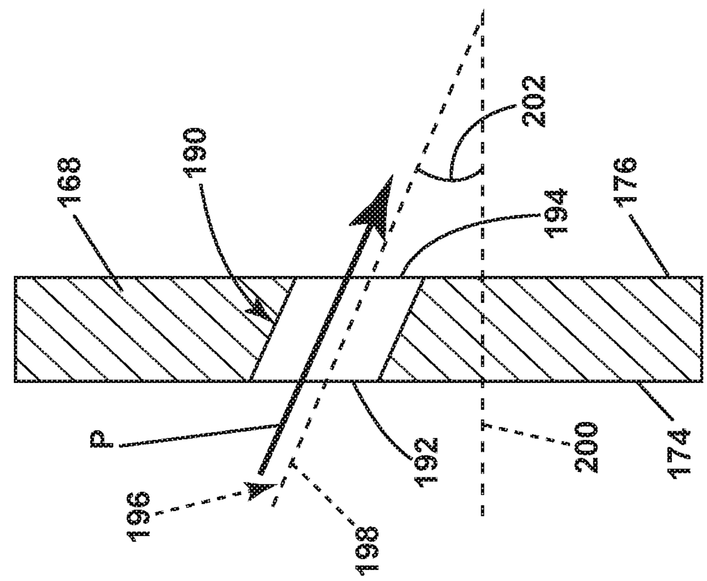
FIG. 11B is a cross-sectional view across section 11B-11B of FIG. 11A showing the angled disposition of the openings of FIG. 11A, in accordance with various aspects described herein.

Referring to FIG. 11A in particular, an opening 190 can be angled, such that an inlet 192 on the first side 174 is offset from an outlet 194 on the second side 176 of the opening 190. FIG. 11B is taken across section 11B-11B of FIG. 11A. A centerline 196 through the opening 190 can define an opening axis 198. The opening axis 198 can be offset from a wall axis 200 perpendicular to the surface of the fin 168. An opening angle 202 can be defined between the opening axis 198 and the wall axis 200 as defined by the opening 190. The opening angle 202 can direct the flow of fluid P through the opening 190 in the fin 168 in a desired direction. The opening angle 202 can be 30-degrees, in one non-limiting example. Additionally, the opening 190 can be used to distribute the flow of fluid P based upon pressure differentials on opposing sides of the fin 168. Directing and distributing the flow of fluid P based upon or opening angle 202 can improve the heat-dissipating performance of the fins 168. For example, the opening angle 202 can be used to provide a greater volume of fluid to areas of the fins 168 requiring greater cooling.

It should be appreciated that while the angled opening 190 is shown in a substantially axial direction along the flow of fluid P, the angle can be in any direction, such as toward or away from the top or the bottom of the fin, or in the forward or rearward direction of the fin 168 relative to the cooling fluid flow, or any combination thereof.

Figure 12B:
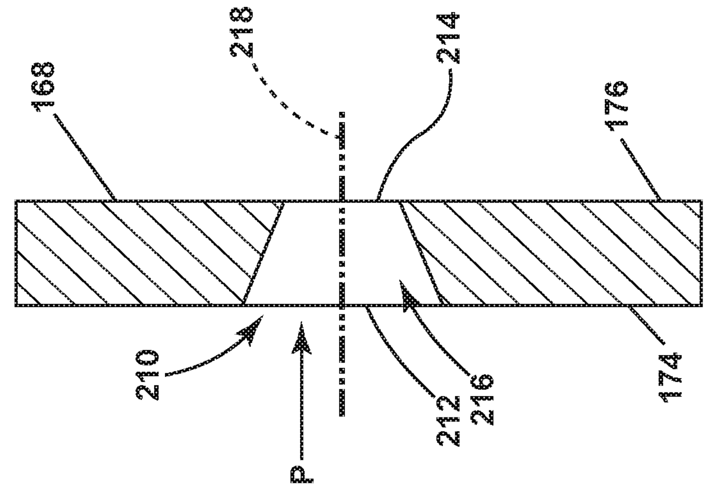
FIG. 12B is a cross-sectional view across section 12B-12B of FIG. 12A showing the converging disposition of the openings of FIG. 12A, in accordance with various aspects described herein.
Figure 12A:
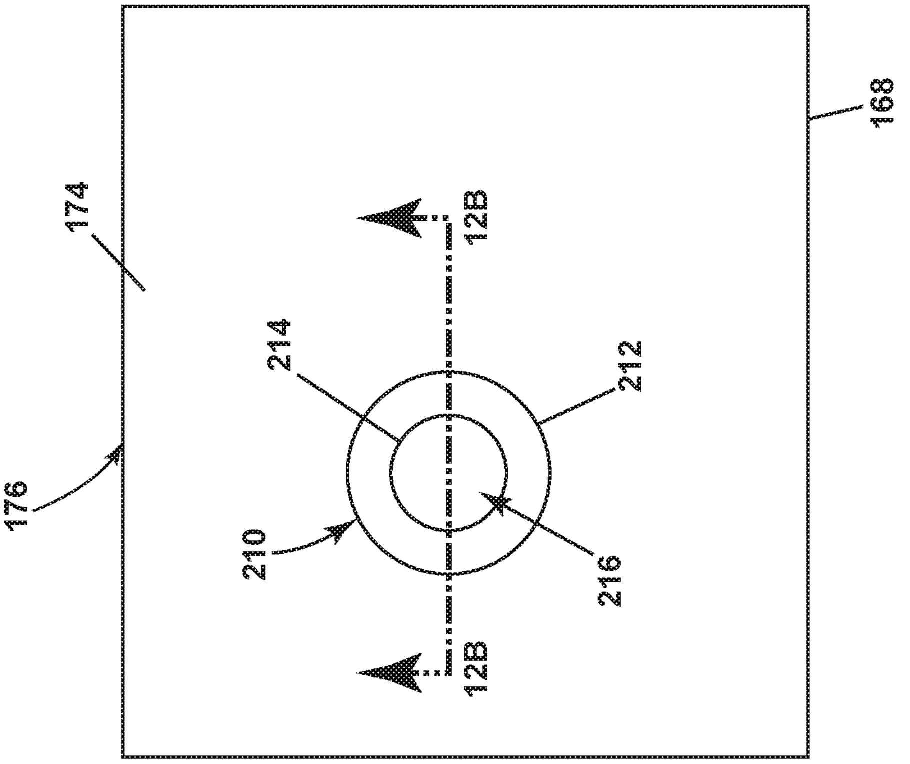
FIG. 12A is a front view of the openings of FIG. 9 having a converging disposition, in accordance with various aspects described herein.

Referring now to FIG. 12A, an opening 210 includes an inlet 212 on the first side 174 and an outlet 214 on the second side 176. The inlet 212 can have a greater diameter than the outlet 214 to define a converging flow path 216 through the opening 210. FIG. 12B, showing a sectional view across section 12A-12A of FIG. 12A, better illustrates the converging flow path 216 in the direction of the flow of fluid P. A passage axis 218 can be defined between the center of the inlet 212 and the center of the outlet 214. The passage axis 218, while shown perpendicular to the longitudinal length of the fin 168, can be disposed at an angle, such as the opening angle 202 of FIG. 11B.

The converging opening 210 can accelerate the flow of fluid F passing through the fin 168. Additionally, orienting the converging opening 210 accelerates the flow of fluid while imparting directionality on the flow of fluid P exiting the opening 210. The flow of fluid P can be driven through the converging opening 210 by pressure differentials between the opposing sides of the fin 168. Such pressure differentials can be developed by any fin orientation as described herein. Such an acceleration of the flow of fluid P can improve the cooling efficiency of the fin 168, such as by increasing the surface area of the fin 168 contacting the flow of fluid F or providing a deterministic flow to improve surface area contact of the fin 168 with the flow of fluid F.

Figure 13B:
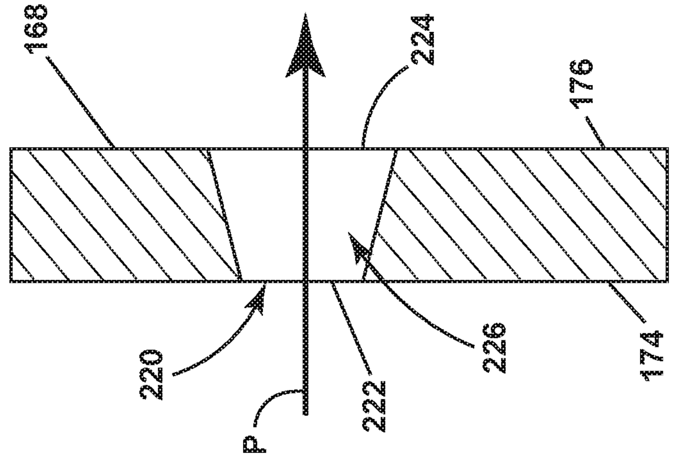
FIG. 13B is a cross-sectional view across section 13B-13B of FIG. 13A showing the diverging disposition of the openings of FIG. 13A, in accordance with various aspects described herein.
Figure 13A:
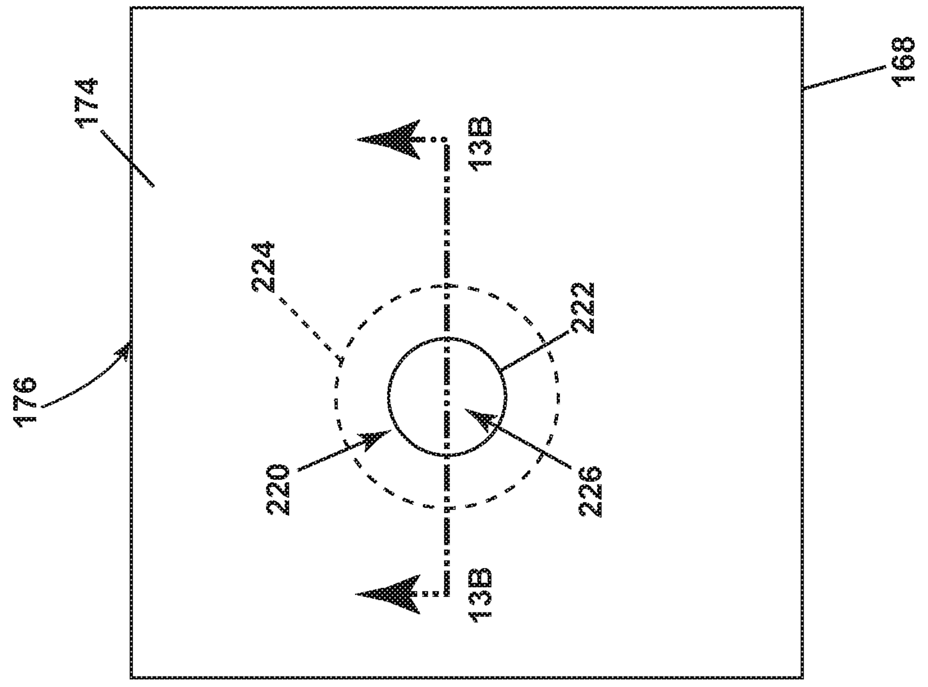
FIG. 13A is front view of the openings of FIG. 9 having a diverging disposition, in accordance with various aspects described herein.

Referring now to FIG. 13A, an opening 220 can include an inlet 222 on the first side 174 and an outlet 224 on the second side 176, with the outlet 224 having a greater diameter than the inlet 222 to define a diverging flow path 226 through the opening 220. FIG. 13B, showing sectional view across section 13B-13B of FIG. 13A, better illustrates the diverging flow path 226 in the direction of the flow of fluid P. The diverging flow path 226 can decelerate the flow of fluid P through the opening 220.

Similar to the converging opening 210 of FIG. 12B, the diverging opening 220 can be disposed at an angle through the fin 168 to provide directionality to the flow of fluid P exhausting from the opening 220. The flow of fluid P can be driven through the diverging opening 220 by pressure differentials between the opposing sides of the fin 168. Such pressure differentials can be developed by any fin orientation as described herein. Such a deceleration of the flow of fluid P through the diverging opening 220 can improve the cooling efficiency of the fin 168, such as by increasing the surface area of the fin 168 contacting the flow of fluid P.

Figure 14B:
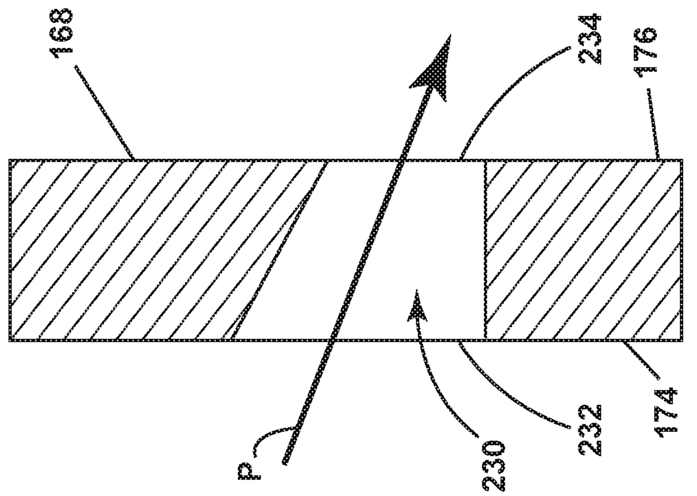
FIG. 14B is a cross-sectional view across section 14B-14B of FIG. 14A showing the angled and converging disposition, of the openings of FIG. 14A, in accordance with various aspects described herein.
Figure 14A:
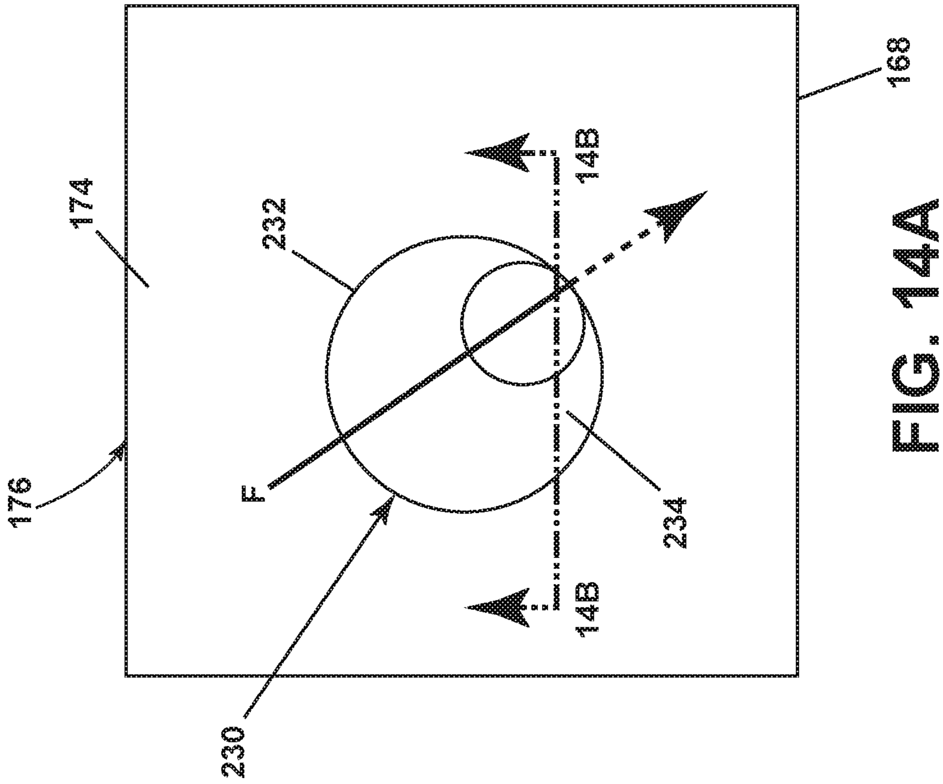
FIG. 14A is a front view of the openings of FIG. 9 having both an angled and converging disposition, in accordance with various aspects described herein.

Referring now to FIG. 14A, an opening 230 can include an inlet 232 on the first side 174 and an outlet 234 on the second side 176 defining an angled, converging flow path 236 through the fin 168. The outlet 234 is positioned below the inlet 232, such that the converging flow path 236 provides a directionality toward the bottom of the fin 168. Such a directionality is beneficial in driving the flow of fluid P to the bottom of the fin 168 to improve convective cooling near the base of the fin 168.

Referring to FIG. 14B, showing a sectional view across section 14B-14B of FIG. 14A, the opening 230 is converging to accelerate the flow of fluid P. As such, convection across the opening 230 and along the fin 168 near the outlet 234 can be improved. As the flow path 236 directs the flow of fluid P to the base of the fin 168, the accelerated flow can further improve convective cooling of the fin 168 near the base of the fin 168. The flow of fluid P can be driven through the opening 230 by the pressure differentials on opposing sides of the fins 168, such as those differentials created by the fin orientations described herein.

Additionally, it should be appreciated that the cooling hole opening as shown in FIGS. 11-14 can induce a turbulence on the flow of fluid P. Such a turbulence can improve heat transfer along the surface of the fins. In addition, it is contemplated that the fin can include an uneven surface or non-smooth surface, as well as a rough surface coating to further improve turbulence generated by the fins such that the heat transfer coefficient is increased. Such a rough surface can include discrete turbulence-generating structures, such as riblets, vortex inducers, or turbulators. Particular, non-limiting examples can include chevrons, or fastback turbulators.

Figure 15:
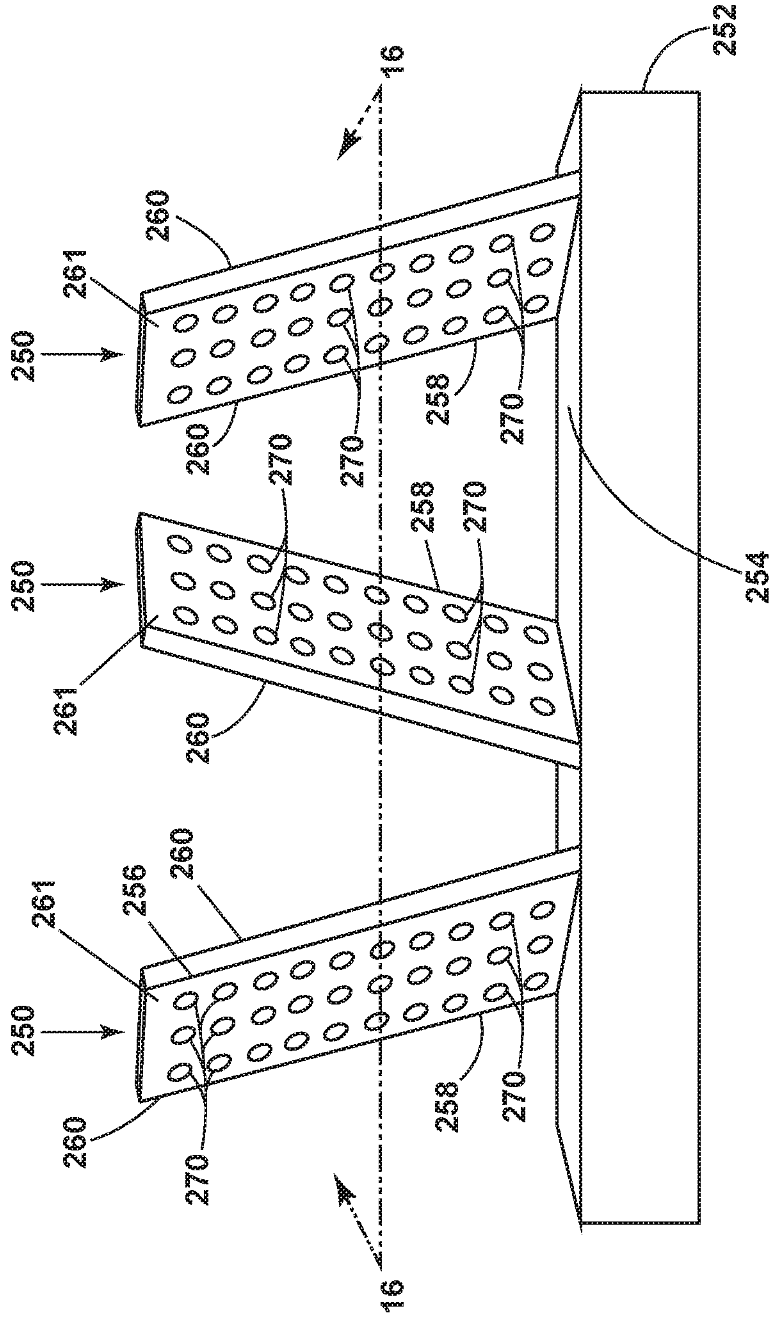
FIG. 15 is a front perspective view of a set of fins having the first and second angled orientations of FIGS. 4-7, and having openings with the angled and converging dispositions of FIGS. 14A and 14B, in accordance with various aspects described herein.
Figure 16:
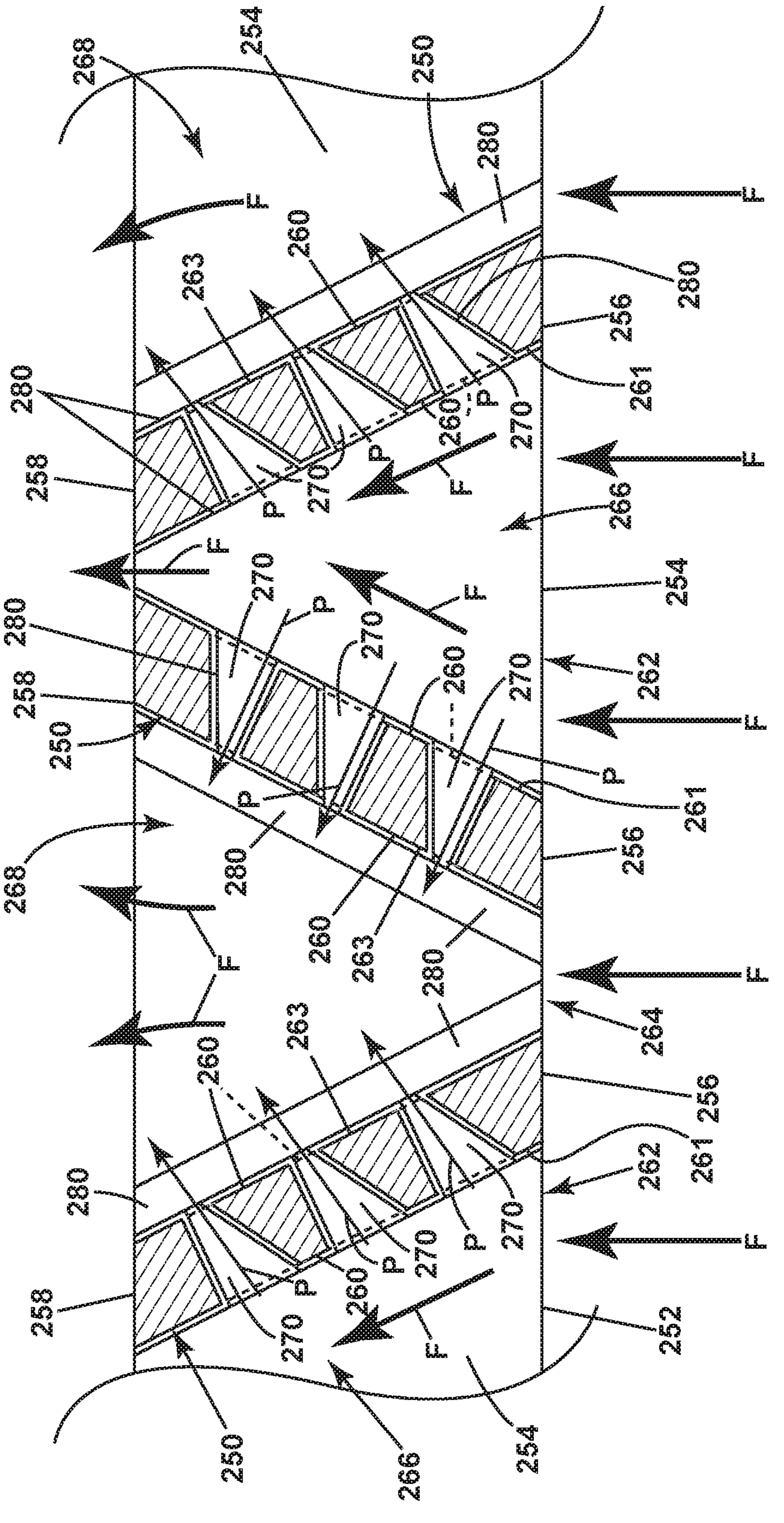
FIG. 16 is a top, perspective view of the fins of FIG. 15 showing the airflow passing through the fins and the openings, in accordance with various aspects described herein.

Referring now to FIG. 15, illustrating a front perspective view of a portion of a set of fins 250 mounted to a wall 252 along a base surface 254 of the wall 252. The fins 250 include a front wall 256 and a rear wall 258 (FIG. 16), with opposing sidewalls 260. In the front perspective view, the sidewalls 260 are angled, such as angled at the first and second fin angles 96, 128, as described in FIGS. 4-5 and FIGS. 6-7, respectively. At such an angle, a planar first face can defined a first side 261, hiding a planar second face defining a second side 263 (FIG. 16). A plurality of openings 270 are provided in the fins 250 permitting a flow of fluid to pass through the openings to either sidewall 260.

Referring now to FIG. 16, illustrating a perspective plan view of the set of fins 250 of FIG. 15, of FIG. 15, one sidewall 260 is visible, showing the second side 263, while the first side 261 (FIG. 15) is hidden from view. The fins 250 are angled in the angled orientation relative to the second fin angle 128, with the hidden first sidewall 261 facing the base surface 254. The orientation of the fins 250 defines a wide inlet 262 and a narrow inlet 264. The angled fins 250 further define a converging flow path 266 extending from the wide inlet 262 and a diverging flow path 268 extending from the narrow inlet 264 in the direction of the flow of fluid F. Each fin 250 includes a set of openings 270. The openings 270 are converging from the converging flow path 266 toward the diverging flow path 268 and can be angled downwardly toward the outer surface 254 of the wall 252.

In operation, a flow of fluid F is provided to the fins 250. The flow of fluid F can be in a substantially streamline, linear direction, while it is contemplated that the flow of fluid F can be somewhat turbulent or non-linear, having local magnitudes. In such a case of turbulent or non-linear flows, the orientation of the fins 250 can be adapted based upon such flows. The flow of fluid F enters the fins 250 in the wide and narrow inlets 262, 264. A greater portion of the flow of fluid F will enter the fins through the wide inlets 262. As the wide inlets 262 provide the flow of fluid F along the converging flow path 266 and the narrow inlets 264 provide the flow of fluid F along the diverging flow path 268, a pressure differential forms between the flow paths 266, 268. As such, a portion of the flow of fluid P is drawn through the openings 270. The openings 270 provide for greater surface area on the fins 250 for convective cooling. Additionally, the openings 270 provides for improved flows through the fins 250, in combination with the orientation of the fins 250 to improve cooling efficiency of the fins 250.

Additionally, the angled orientation of the fins 250 toward the outer surface 254 of the wall 252 provides for a greater volume of the flow of fluid F to pass near the base of the fins 250 to improve convection near the base of the fins 250.

Furthermore, it is contemplated that a piezo-device can be incorporated into the fins 250 in order to enhance flow of fluid through the openings 270. A piezo-device can be added to a fin in order to enhance or encourage a flow of fluid F through the openings 270.

While various examples have been used to describe the fins for convective cooling, it should be appreciated that the fins are not so limited. The fins 250, while shown as generally linear or airfoil-shaped, can be any shape or orientation, such as linear, non-linear, arcuate, angled, unique, having discrete local shapes or feature, or any combination thereof in non-limiting examples. Additionally, the cooling hole openings as described herein can be strategically placed on the fins to improve cooling efficiency. Such placements can include areas of increased or decreased pressure, velocities, temperatures, or particular shaped features of the fins.

It is further contemplated that the fins 250 include a radiation heat coating 280 on the exterior of the fins 250. Additionally, the radiation heat coating 280 can be provided on the interior of the openings 270. Such a coating can include a high emissivity, such as a black-color surface coat.

Such complex designs of the fins can be created, in one non-limiting example, by additive manufacturing such as 3D printing including direct metal laser melting (DMLM). Such a manufacture method enables generation of the complex features of the fins as described herein, previously unavailable.

A method of forming the fin heat exchanger assembly on a base surface can include forming, via additive manufacturing, a set of fins extending from the base surface with at least one set of fins including a first planar face and a second planar face separated by a width of the fin and a set of openings extending between the first planar face and the second planar face.

The base surface, for example, can include any base surface to which the fins can mount, such as the base surface 78 of FIG. 4 or the base surface 122 of FIG. 6, in non-limiting examples. Additive manufacturing can include any three-dimensional synthesized product, such as 3D printing including but not limited to DMLM, Direct energy deposition, or powder bed fusion.

The set of fins including the first and second planar faces separated by the width of the fin can be any such fin, such as the fins described in FIGS. 4-7. A set of openings can include one or more openings in the fin, such as the openings described in FIGS. 9-15.

Additionally, a passage can be defined between two or more fins, with such a passage being converging or diverging. Such passages can be the passages 88, 90, 158, 160, 188, 190 as described herein.

The method can further include angling the fins relative to a local flow of fluid. For example, angling the fins can include angling the fins relative to the first fin angle 96 of FIGS. 4 and 5, or relative to the second fin angle 126 of FIGS. 6 and 7, or both. Such angling of the fins increases the surface area of the fins confronting the flow of fluid passing through the fins.

Further still, the method can include shaping the set of openings, such as shaped as shown in FIGS. 9-14. Such shaping can include openings that are linear, non-linear, curved, angled, diverging, converging, or any combination thereof, in non-limiting examples. Shaping the openings can provides directionality for the flow of passing through the openings and the fins. Such directionality can be used to locally direct the flow to improve cooling efficiency of the fins.

Additionally, the fins orientation and geometry can improve heat transfer with adjacent local structures.

The aspects of the present disclosure provide a heat-dissipating configuration for an avionics system card or other heat producing component. The heat exchanger or heat-dissipating configuration can be configured to cool steady state heat loads or transient heat loads. The technical effect is that the aspects described herein enable the cooling of said heat producing component by way of conducting at least a portion of heat generated to a wall having one or more fins disposed on said wall. One advantage that can be realized is superior convective cooling capabilities of the fin design compared with conventional systems. Thus, even during expected environmental conditions and diurnal cycles, the fins can dissipate heat generated by a heat producing component. Another advantage is that the fins and systems as described herein can account for a 5-10% increase in convective cooling efficiency, or more. In addition, this increase in efficiency can be appreciated while decreasing system weight.

By increasing the heat-dissipation, a higher power density can be achieved in the same avionics system card or constrained space. An increased power density allows for increased computational power or increased sensor or emitter power supported within the physically-constrained space, weight-constrained space, or volume-constrained space. Yet another advantage is that heat-producing configurations allow for the retro-fitting of additional capabilities within existing avionics chassis or similar heat-producing components, or the design of a new system with power densities not currently achievable using convention thermal dissipation configurations.

Many other possible configurations in addition to that shown in the above figures are contemplated by the present disclosure. In one non-limiting example, while the front cover has been described as including the opening, any of the walls of the chassis can be configured to include the fins extending exterior of the chassis. To the extent not already described, the different features and structures of the various aspects can be used in combination with others as desired. That one feature cannot be illustrated in all of the aspects is not meant to be construed that it cannot be, but is done for brevity of description. Thus, the various features of the different aspects can be mixed and matched as desired to form new aspects, whether or not the new aspects are expressly described. Combinations or permutations of features described herein are covered by this disclosure.

This written description uses examples to disclose aspects of the invention, including the best mode, and also to enable any person skilled in the art to practice aspects of the invention, including making and using any devices or systems and performing any incorporated methods. The patentable scope of the invention is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A fin assembly exposed to a flow of fluid for thermal cooling, comprising:

a base surface configured to transfer heat from component; and a set of fins, extending from the base surface into the flow of fluid, each fin defining a respective fin axis parallel to the base surface and spaced from an adjacent fin to form a linear fluid flow path defining a flow axis therethrough parallel to the flow of fluid, with at least one fin of the set of fins including an angled orientation with respect to the flow axis and the at least one fin of the set of fins including a first planar face defining a first side and a second planar face separated from the first planar face by a width of the fin and defining a second side; and a set of openings extending between the first planar face and the second planar face, each opening including an inlet and an outlet and defining an opening axis therethrough that is at an angle with respect to a wall axis being defined perpendicular to the first planar face, wherein the opening distributes a fluid flow therethrough based upon a pressure differential developed on the first and second sides of the at least one fin, wherein the fluid flow through the openings is entrained by the flow of fluid in the linear fluid flow path to thereby define a non-linear flow path;

wherein the set of fins is configured to dissipate heat from the component to fluid adjacent the set of fins.

2. The fin assembly of claim 1 wherein the angled orientation defines a first fin angle.

3. The fin assembly of claim 2 wherein the first fin angle is four degrees.

4. The fin assembly of claim 2 wherein the angled orientation is further defined relative to an axis perpendicular to the base surface defining a second fin angle.

5. The fin assembly of claim 4 wherein the second fin angle is less than ninety degrees.

6. The fin assembly of claim 1 wherein the set of openings are at a 30-degree angle from the first planar face or the second planar face.

7. The fin assembly of claim 1 wherein the base surface is a wall.

8. The fin assembly of claim 7 wherein the wall is a portion of an avionics chassis.

9. The fin assembly of claim 7 wherein the wall has a profile that is rectangular.

10. The fin assembly of claim 1, further comprising a piezo-device incorporated into the fin and configured to enhance airflow from the first side to the second side.

11. The fin assembly of claim 1 wherein at least some of the fins of the set of fins are unequally spaced from each other.

12. The fin assembly of claim 1 wherein at least some of the set of openings are coated with a high emissivity coating configured to increase heat radiation.

13. A finned heat exchanger, comprising:

a wall configured to transfer heat from a component; and a set of fins extending from the wall into a flow of fluid, each fin defining a respective fin axis parallel to the wall and spaced from an adjacent fin to form a linear fluid flow path defining a flow axis therebetween parallel to the flow of fluid, with at least one fin of the set of fins including a first planar face and a second planar face separated by a width of the fin and a set of openings extending between the first planar face and the second planar face;

wherein each opening of the set of openings includes an inlet and an outlet defining an opening axis therethrough that is offset from a wall axis being defined perpendicular to the first planar face and the second planar face by an opening angle, wherein the opening distributes a fluid flow based upon a pressure differential developed on the first side and the second side of the at least one fin, wherein the fluid flow through the set of openings is entrained by the flow of fluid in the linear fluid flow path to thereby defines a non-linear flow path; and wherein at least one fin axis is at an angle relative to the-flow axis to provide increased surface area of one of the first or second planar face confronting the flow of fluid to dissipate heat from the component.

14. The finned heat exchanger of claim 13 wherein the flow path defined between a pair of fins of the set of fins is one of converging or diverging, to thereby create a venturi effect of fluid flowing past the set of fins.

15. The finned heat exchanger of claim 13 wherein the fin further comprises an airfoil shape configured to create an unequal pressure distribution that pulls air from one side of the fin to another side.

16. The finned heat exchanger of claim 13 wherein the flow of fluid is a flow of air.

* * * * *